(12) United States Patent
Morgan et al.

(10) Patent No.: US 6,327,167 B1
(45) Date of Patent: Dec. 4, 2001

(54) DIE ARCHITECTURE ACCOMMODATING HIGH-SPEED SEMICONDUCTOR DEVICES

(75) Inventors: Donald M. Morgan; Todd A. Merritt, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,996

(22) Filed: Aug. 31, 2000

Related U.S. Application Data

(62) Division of application No. 09/439,972, filed on Nov. 12, 1999, now Pat. No. 6,144,575, which is a continuation of application No. 09/301,643, filed on Apr. 28, 1999, now Pat. No. 5,995,402, which is a continuation of application No. 09/023,254, filed on Feb. 13, 1998, now Pat. No. 5,936,877.

(51) Int. Cl.$^7$ .................................................. G11C 5/02
(52) U.S. Cl. ........................ 365/51; 365/63; 365/230.03
(58) Field of Search ....................... 365/51, 63, 230.03, 365/72

(56) References Cited

U.S. PATENT DOCUMENTS

| | | |
|---|---|---|
| 4,660,174 | 4/1987 | Takemae et al. ................ 365/63 |
| 4,974,053 | 11/1990 | Kinoshita et al. ............... 357/68 |
| 5,073,816 | 12/1991 | Wakefield et al. ............... 357/74 |
| 5,109,265 | 4/1992 | Utesch et al. .................. 357/45 |
| 5,142,492 | 8/1992 | Shimizu et al. ................. 365/51 |
| 5,150,330 | 9/1992 | Hag .......................... 365/230.03 |
| 5,231,607 | 7/1993 | Yoshida et al. ................ 365/226 |
| 5,251,168 | 10/1993 | Chung et al. .................. 365/51 |
| 5,287,000 | 2/1994 | Takahashi et al. .............. 257/676 |
| 5,293,334 | 3/1994 | Shimizu ........................ 365/51 |
| 5,357,478 | 10/1994 | Kikuda et al. ................. 365/230.03 |
| 5,408,129 | 4/1995 | Farmwald et al. .............. 257/692 |
| 5,636,174 | 6/1997 | Rao ........................... 365/230.03 |
| 5,812,490 | 9/1998 | Tsukude ....................... 365/233 |
| 5,831,924 | 11/1998 | Nitta et al. .................. 365/230.03 |
| 5,838,604 | 11/1998 | Tsuboi et al. ................. 365/63 |
| 5,880,987 | 3/1999 | Merritt ........................ 365/51 |
| 5,936,877 | 8/1999 | Morgan et al. ................. 365/51 |
| 5,943,285 | 8/1999 | Kohno ......................... 365/230.03 |
| 5,995,402 | 11/1999 | Morgan et al. ................. 365/51 |
| 6,104,627 | * 8/2000 | Kai ............................ 365/51 |
| 6,144,575 | 11/2000 | Morgan et al. ................. 365/51 |

* cited by examiner

*Primary Examiner*—Son Mai
(74) *Attorney, Agent, or Firm*—Dorsey & Whitney LLP

(57) ABSTRACT

In a semiconductor memory device, a die architecture is provided that arranges memory arrays into a long, narrow configuration. Bond pads may then be placed along a long side of a correspondingly shaped die. As a result, this architecture is compatible with short lead frame "fingers" for use with wide data busses as part of high speed, multiple band memory integrated circuits.

2 Claims, 13 Drawing Sheets

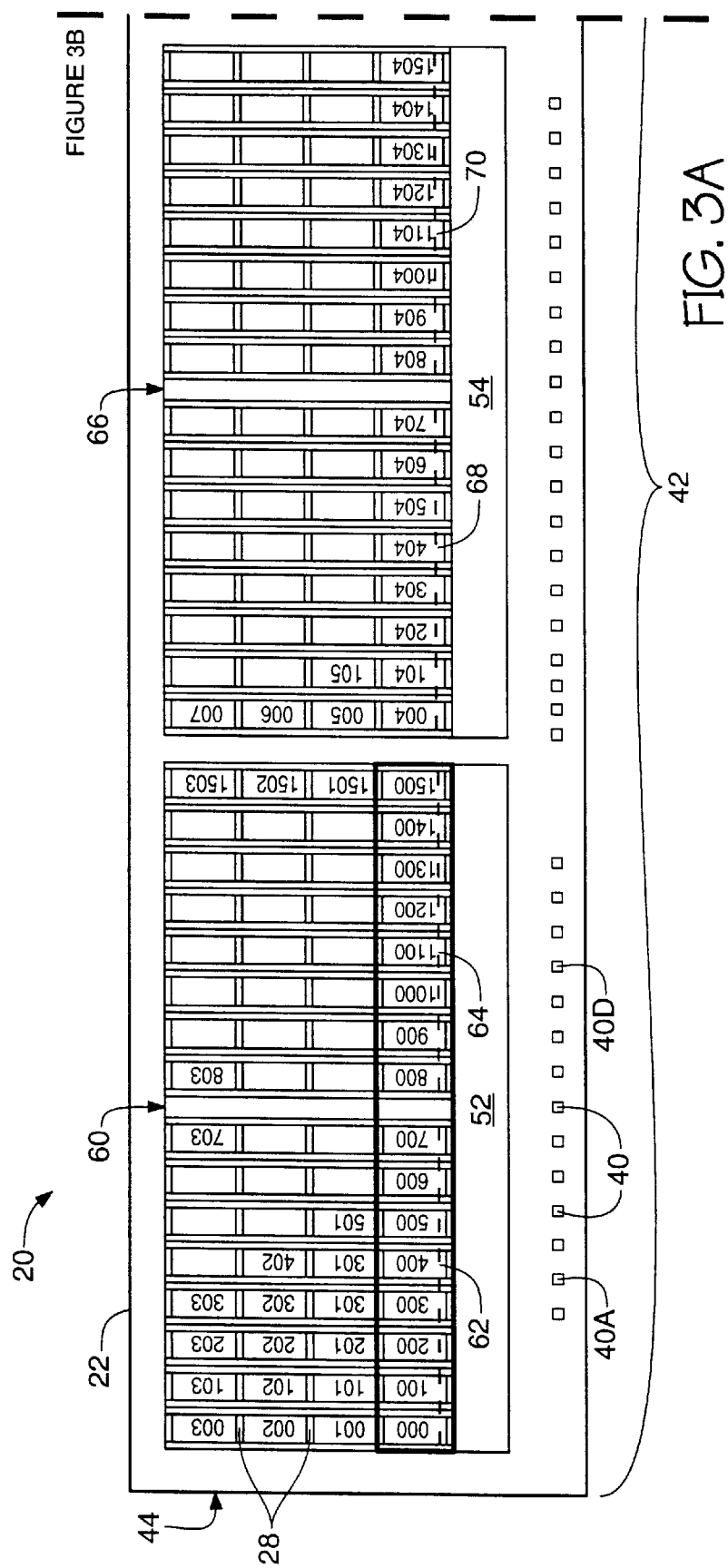

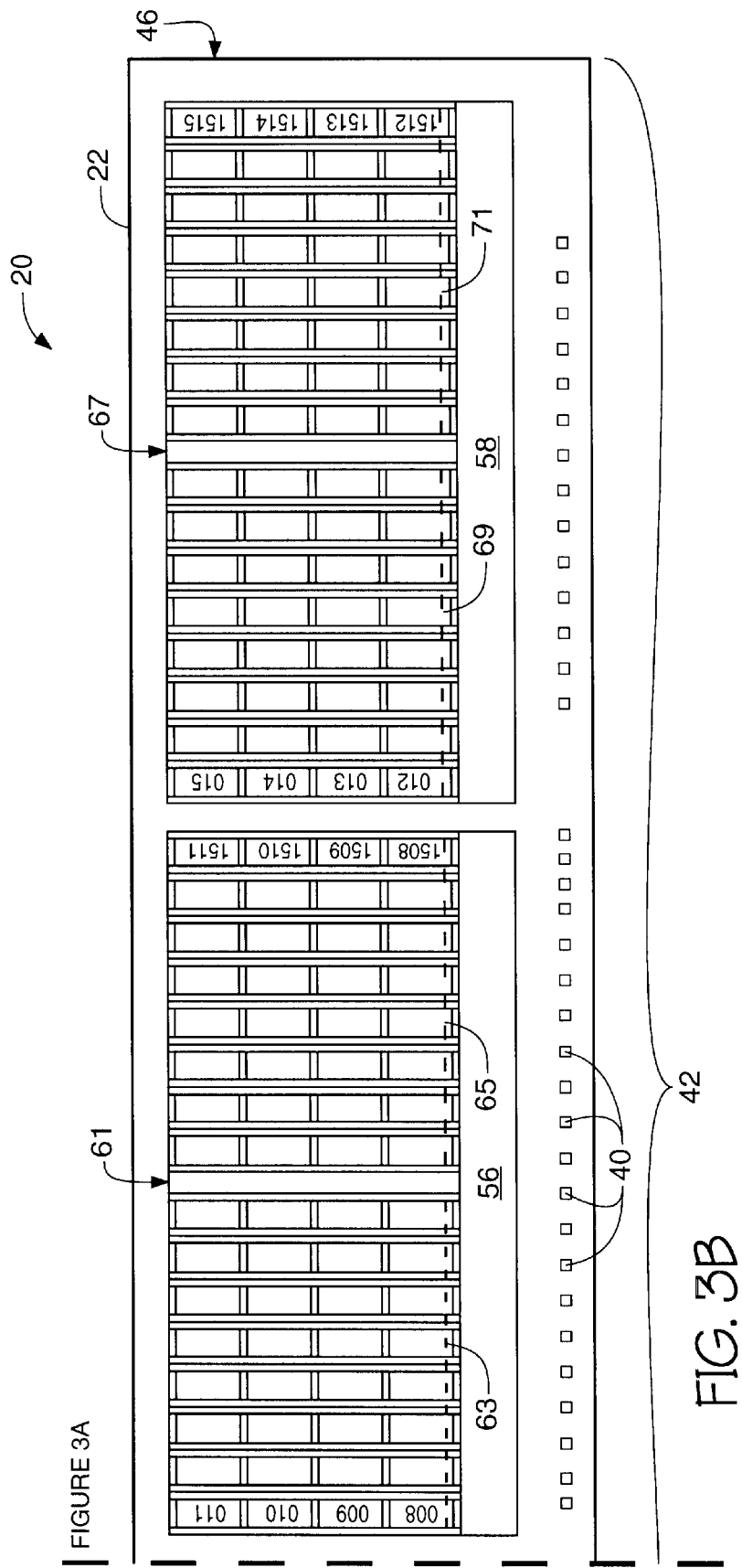

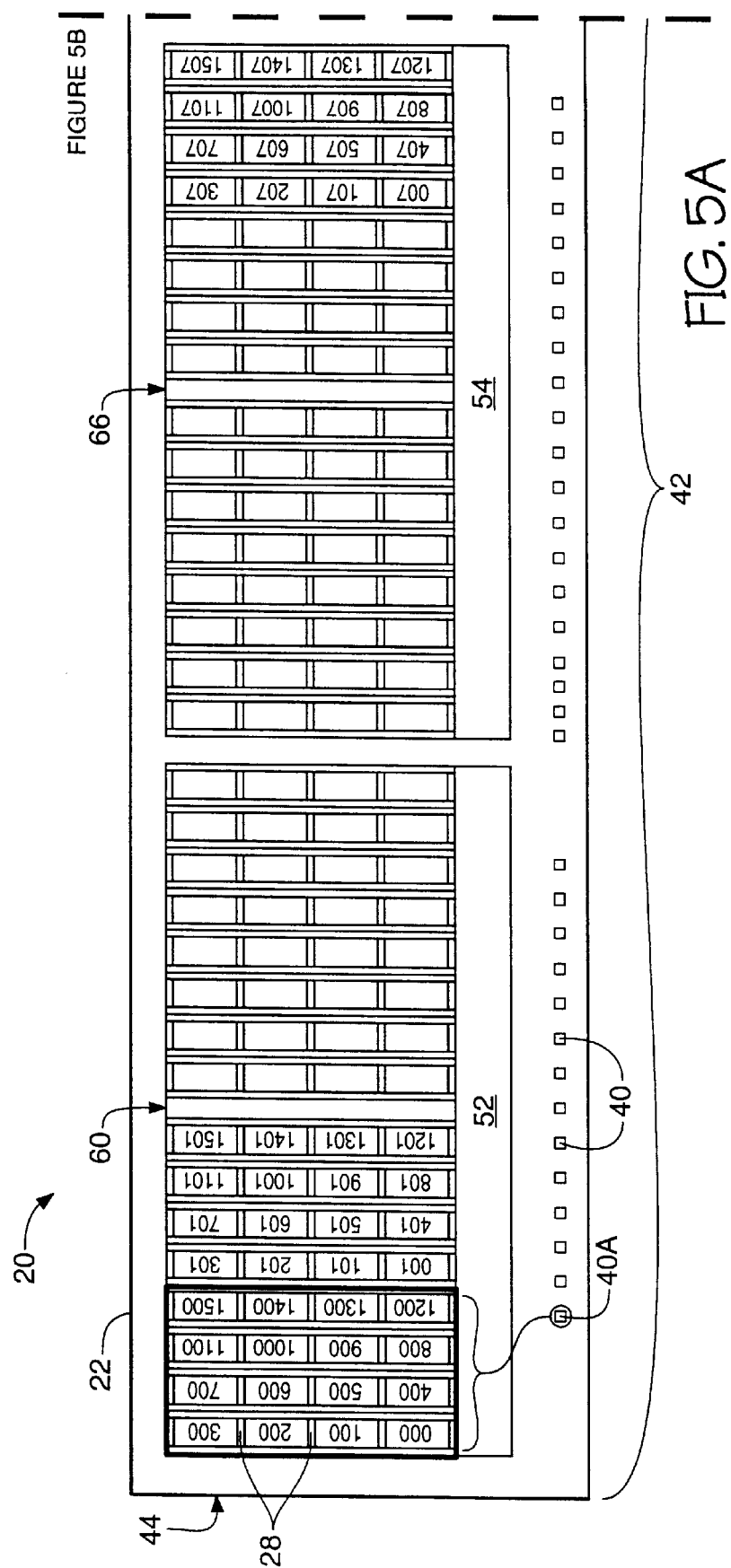

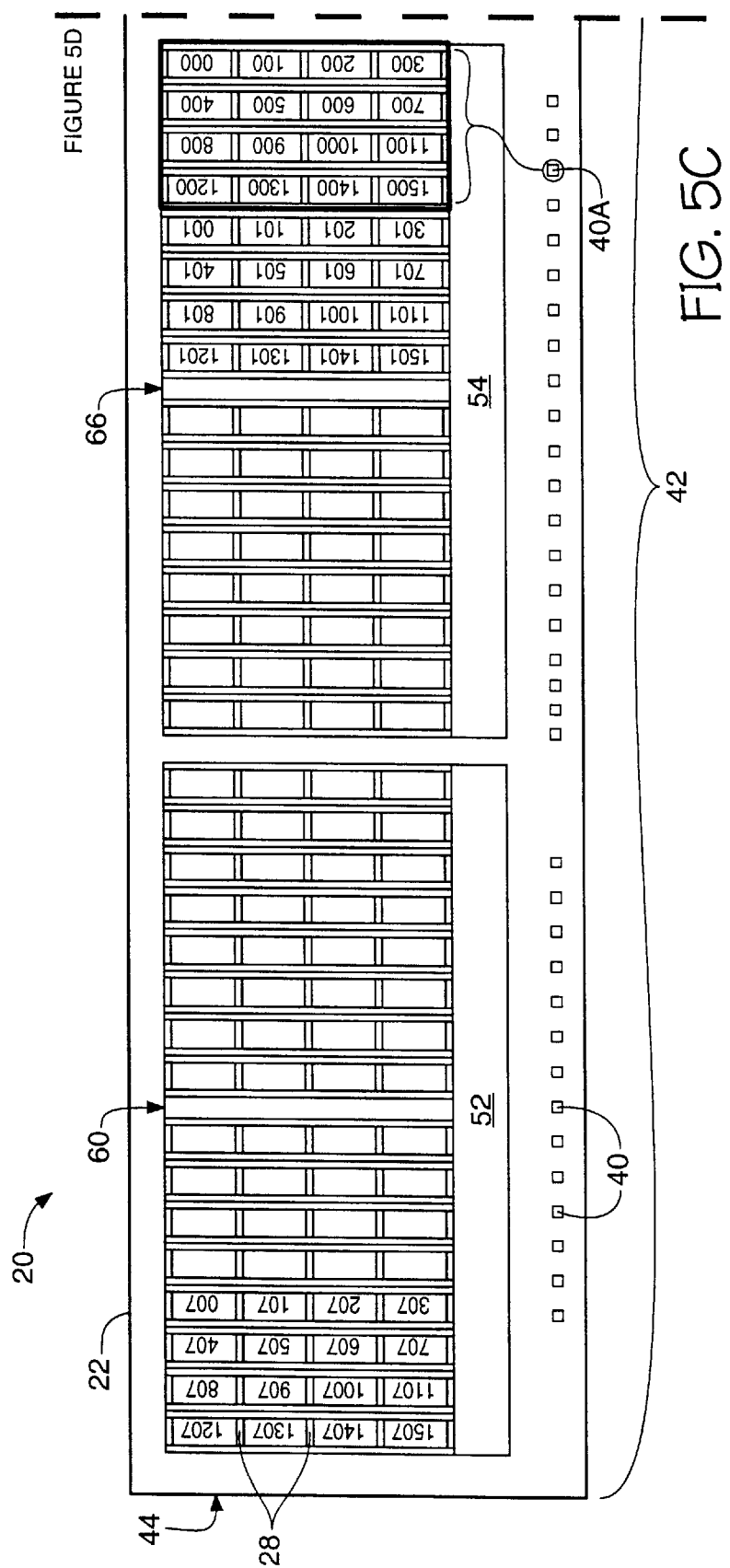

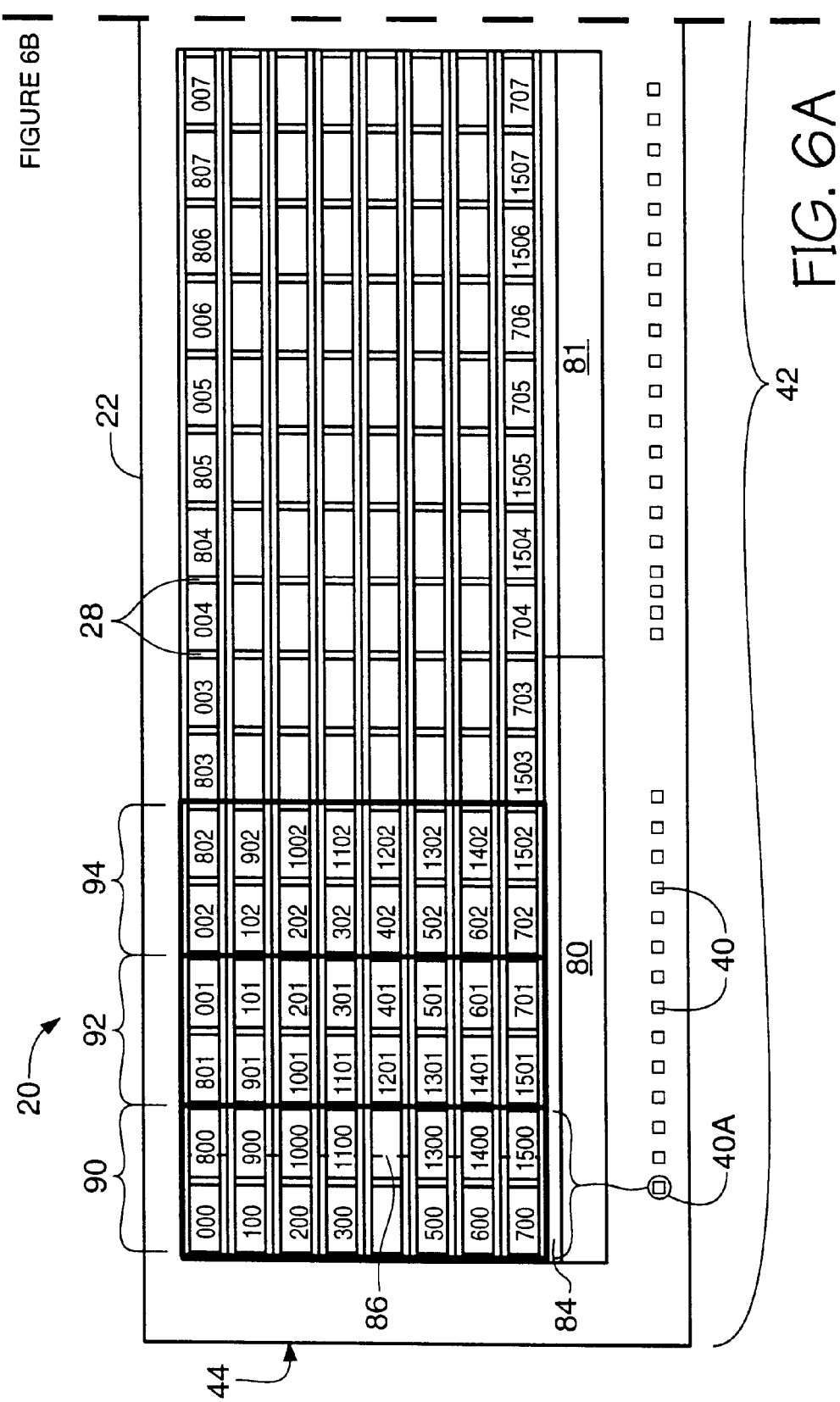

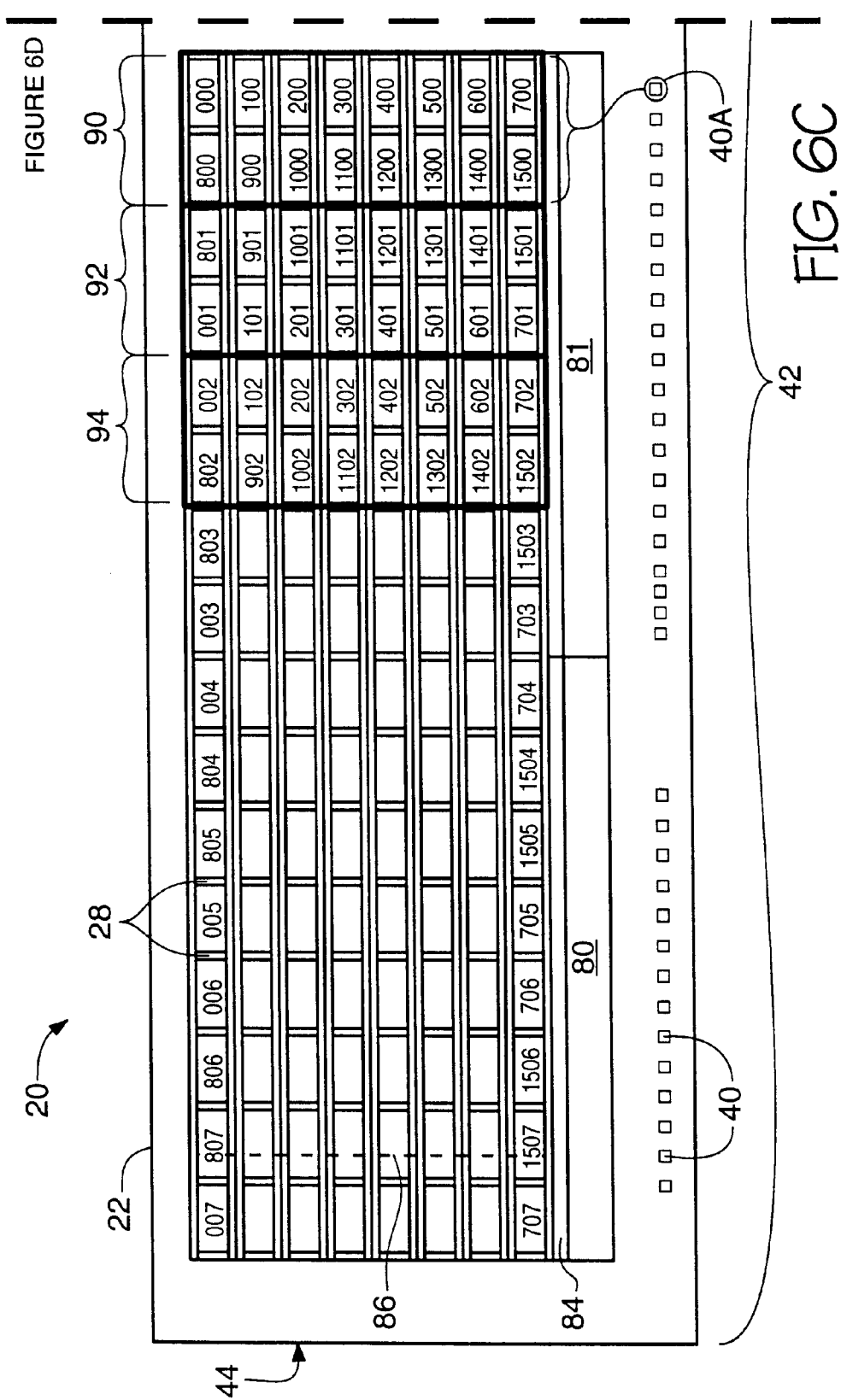

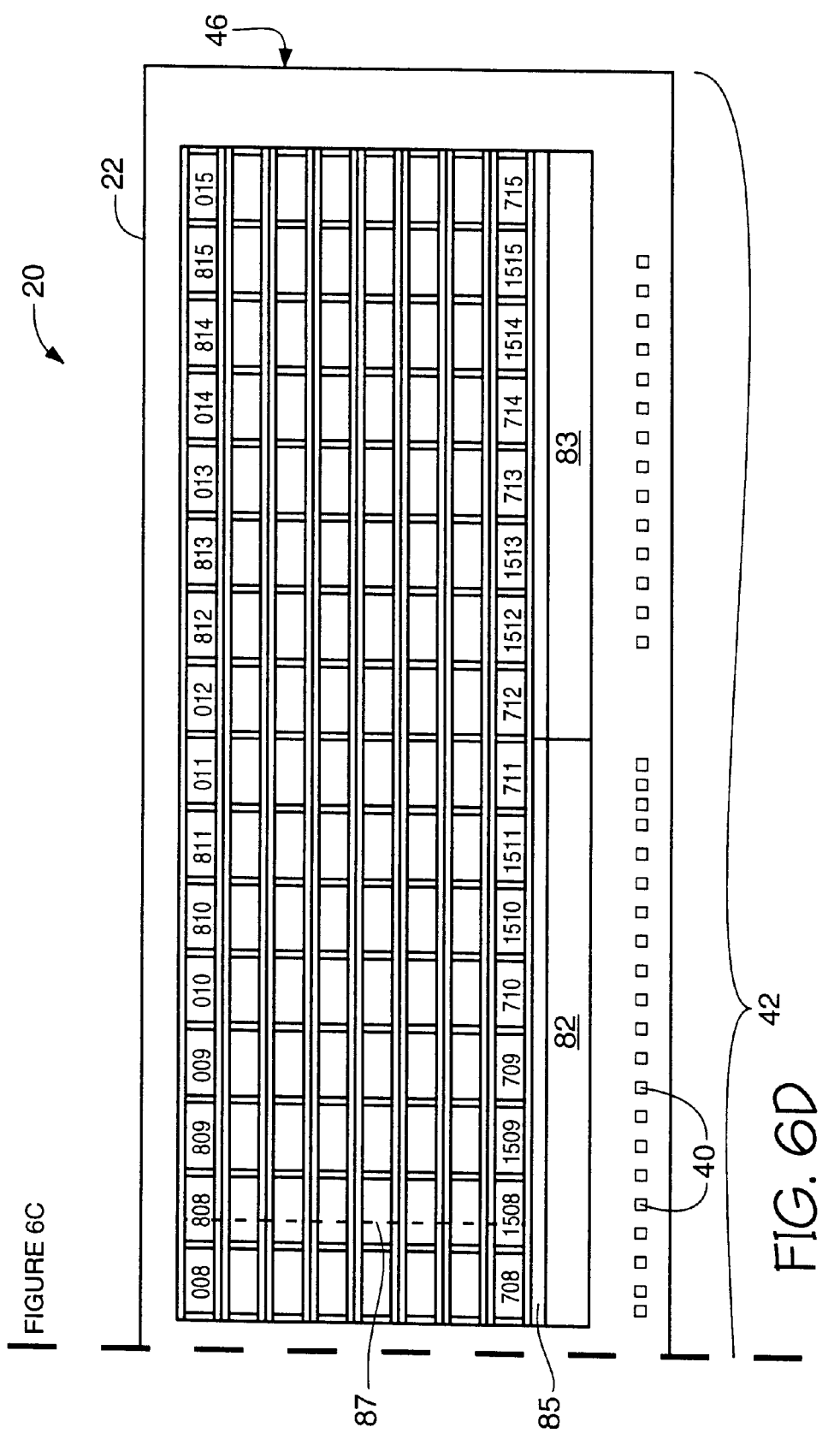

DIE ARCHITECTURE ACCOMMODATING HIGH-SPEED SEMICONDUCTOR DEVICES

RELATED APPLICATIONS

This application is a divisional of U.S. application Ser. No. 09/439,972, filed Nov. 12, 1999 U.S. Pat. No. 6,144,575; which is a continuation of U.S. application Ser. No. 09/301,643, filed Apr. 28, 1999 and issued as U.S. Pat. No. 5,995,402; which is a continuation of U.S. application Ser. No. 09/023,254, filed Feb. 13, 1998, and issued as U.S. Pat. No. 5,936,877.

TECHNICAL FIELD

This invention relates generally to semiconductor devices. In particular, this invention relates to die architecture for semiconductor memory devices configured to execute high speed applications, such as those performed in synchronous dynamic random access memory devices.

BACKGROUND OF THE INVENTION

Assembling an integrated circuit package often involves attaching a die to a lead frame. As an additional part of assembly, bond wires are used to electrically connect the conductive leads of the lead frame to the die's bond pads. The die/lead frame assembly is then encased in a housing with the outer ends of the conductive leads remaining exposed in order to allow electrical communication with external circuitry. The die's architecture may represent one of many circuitry configurations, such as a Dynamic Random Access Memory (DRAM) circuit or, more specifically, a synchronous DRAM (SDRAM) circuit.

The high speed synchronous operations associated with SDRAM circuitry often involve communication with an external device such as a data bus. Occasionally, the data bus may be relatively wide in comparison to the standard width of prior art SDRAM dies. The width of the data bus, in turn, requires an appropriate number of conductive leads positioned to accommodate the bus. Further, the position of the conductive leads and their spacing limitations require a certain amount of die space for bond pad connection. However, the prior art does not provide a die having one particular region that can provide enough bond pads to accommodate all of the conductive leads. Rather, the architecture of the die as found in prior art allows for bond pads to be located in different areas of the die. Consequently, conductive leads of different lengths are needed to connect the bond pads to the relatively wide data bus. These differing lengths slow the operations of the SDRAM, or any semiconductor device for that matter, as it takes longer for signals to travel through the longer conductive leads. Thus, if synchronized signals are desired, the speed of the device is limited by the speed of signal propagation through the longest conductive lead. The longer leads also have a greater inductance associated with them, thereby further slowing signal propagation. Moreover, the inductance in the longer conductive leads is different from the inductance associated with the relatively short conductive leads. This imbalance in induction makes synchronizing the signals even more difficult.

Thus, it would benefit the art to have a die configuration that provides bond pads in a common location such that all of the conductive leads of the lead frame could be the same length. It would further benefit the art if the die configuration allowed uniformly short conductive leads. Indeed, this desire is mentioned in U.S. Pat. No. 5,408,129, by Farmwald, et al., which discloses a high-speed bus as well as memory devices that are adapted to use the bus. Specifically, Farmwald '129 discloses a narrow multiplexed bus, as demonstrated by Farmwald's preferred embodiment, wherein the bus comprises only nine bus lines. Accordingly, Farmwald's narrow bus allows for a relatively low number of bond pads on the die of a memory device. Farmwald '129 concludes that it would be preferable to place the small number of bond pads on one edge of each die, as that would allow for short conductive leads. Farmwald '129 at col. 18, ln. 37–43. However, it is possible to do so under Farmwald '129 only because the "pin count . . . can be kept quite small" due to the narrow architecture of the bus. Id. at ln. 17–18.

Contrary to the teachings in Farmwald '129, it would be advantageous at times to accommodate a relatively wide bus requiring a large number of pins. It would therefore be additionally advantageous to provide a die capable of providing the correspondingly large number of bond pads on one side of the die.

SUMMARY OF THE INVENTION

Accordingly, the present invention provides die architectures allowing for the relocation of the die's bond pads. One embodiment of this invention arranges for all of the die's bond pads to be located on one side of the die, with the corresponding memory banks arranged accordingly. In a preferred embodiment, the length of the die side having the bond pads is extended relative to prior architectures and the memory arrays are shaped to follow along the extended side. Consequently, the perpendicular sides contiguous to the extended side may be shortened. This architecture has the advantage of allowing the die to cooperate with a lead frame having conductive leads of the same length, thereby balancing inductance and aiding in the ability to synchronize signals. This architecture also has the advantage of allowing the conductive leads to be relatively short, which further increases the operational speed of the die's circuitry and decreases inductance.

BRIEF DESCRIPTION OF THE DRAWINGS

FIGS. 3a and 3b portray a first exemplary embodiment of the present invention.

FIGS. 5c and 5d illustrate a third exemplary embodiment of the present invention.

FIGS. 6c and 6d depict a fifth exemplary embodiment of the present invention.

DETAILED DESCRIPTION OF THE PREFERRED EMBODIMENT

Figure 1:
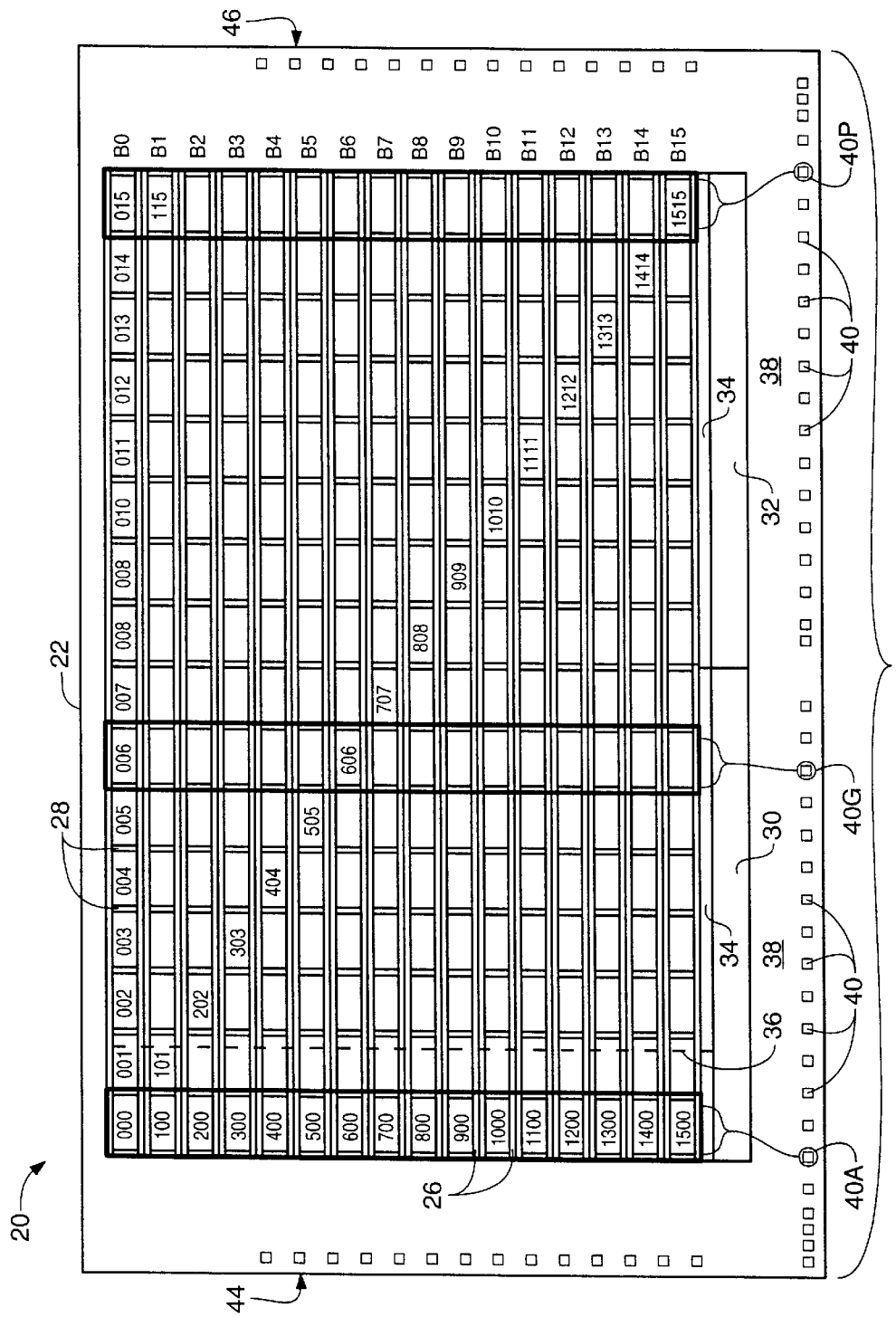
FIG. 1 depicts the architecture of a SDRAM chip as found in the prior art.

FIG. 1 depicts the architecture of an SDRAM 20 as it exists in the prior art. The SDRAM 20 is fabricated on a die 22 and includes sixteen memory banks B0 through B15. The shape of each bank is determined by the number and arrangement of component sub-arrays. In this prior art example, each bank comprises a row of sixteen sub-arrays. Bank B0, for example, comprises sub-arrays 000 through 015. Similarly, bank B1 comprises sub-arrays 100 through 115. For purposes of explaining the current invention, it is understood that each bank is analogously numbered, ending with sub-arrays 1500 through 1515 comprising memory bank B15. Each sub-array contains a number of memory bit components and accompanying n/p channel sense amplifier circuitry 26 as well as row decoder circuitry 28. The banks B0–B15 are also serviced by a first 64× DC sense amp 30 and a second 64× DC sense amp 32. It should be noted that the size and number of DC sense amps can vary based on the compression rate desired. Column decoder circuitry 34 is located next to the DC sense amps 30 and 32; and a column select line 36 extends from the column decoder circuitry 34 through all of the memory banks B0–B15. Logic circuitry is located in a region 38 on the other side of the DC sense amps 30 and 32 relative to the memory banks B0–B 15. Bond pads 40 are placed on the perimeter of the die 22 to allow easy access. For purposes of this application, the term "bond pad" includes any conductive surface configured to permit temporary or permanent electrical communication with a circuit or node. Further, it should be noted that there exists a series of bond pads—defined here as access pads, wherein each access pad of the series is coupled to one sub-array of each bank, thereby allowing electrical signals to access those sub-arrays. For example, access pad 40A is defined to be coupled to sub-arrays 000, 100, 200, 300, 400, through 1500. Access pad 40G is coupled to sub-arrays 006 through 1506. Access pad 40P, in turn, is defined to be coupled to sub-arrays 015 through 1515. Accordingly, there are thirteen other access pads, each associated with a corresponding column comprising one sub-array from every bank. In order to keep connective circuitry to a minimum, these sixteen access pads are located near their respective sub-arrays. It should be noted that, in FIG. 1, the group of sub-arrays 000 through 1500 is highlighted in bold for purposes of indicating the common association those sub-arrays have with a particular access pad (such as 40A, for these sub-arrays). Groups 006–1506 and 015–1515 are similarly highlighted. Other bond pads 40, representing additional input and output terminals for communicating with the die 22, are placed in the remaining available spaces on the die 22, which may include more than one side of the die 22.

Figure 2:
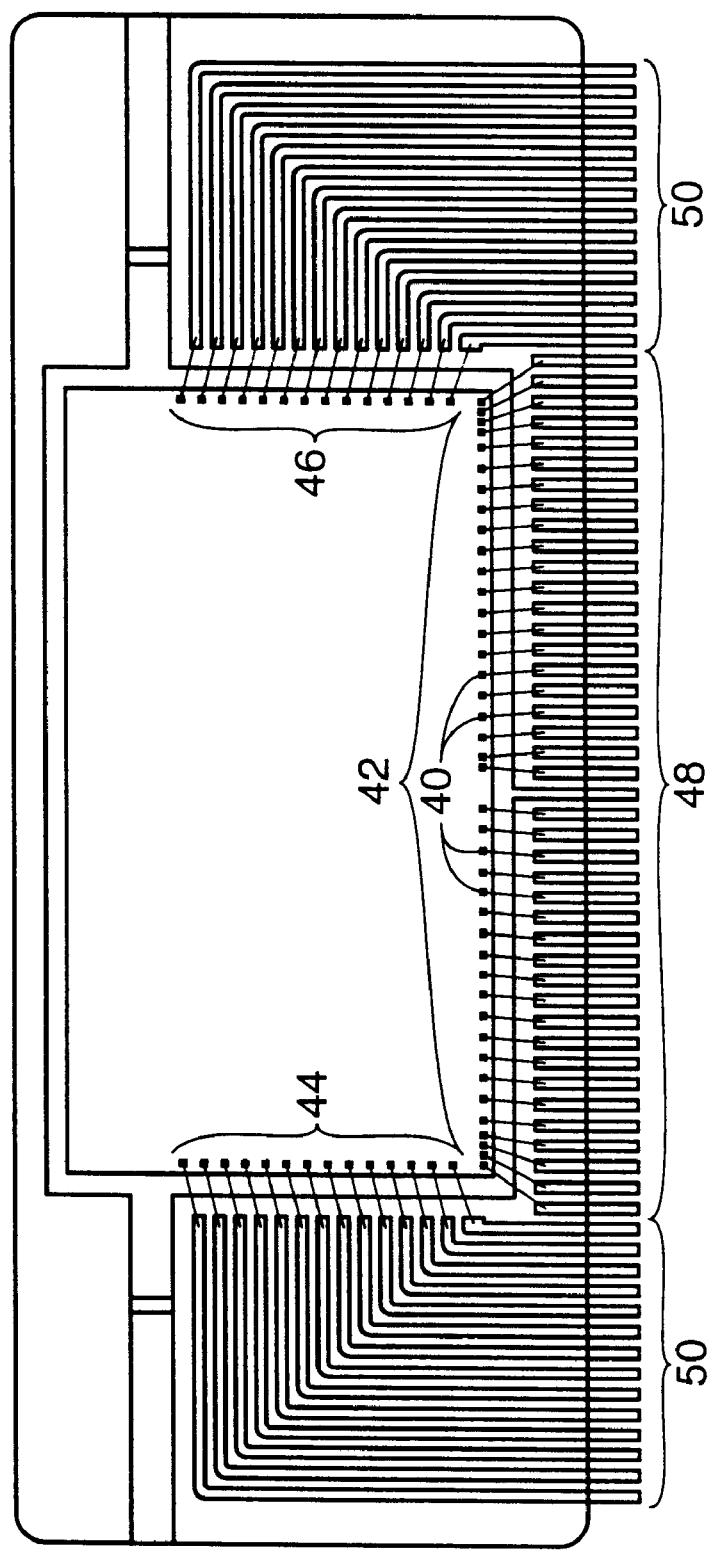
FIG. 2 illustrates an SDRAM chip within a lead frame as found in the prior art.

Packaging of the die 22 may be influenced by the fact that the internal circuitry of the die 22 will be interacting with a data bus. Specifically, as seen in FIG. 2, the die 22 can be placed within a lead frame wherein the conductive leads 48, 50 extend from the die 22 and eventually orient in one direction in anticipation of connecting to the data bus. In FIG. 2, bond pads 40 that are on the die's near side 42—the side that will be closest to the external device—require only relatively short conductive leads 48. However, bond pads 40 along the sides 44, 46 contiguous to the near side 42 require longer conductive leads 50. Assuming that the signal propagation rate through the conductive leads 48, 50 is generally the same, the longer conductive leads 50 will take a longer time to transmit any signals. Moreover, inductance of the longer conductive leads 50 will be greater than inductance of the shorter conductive leads 48.

FIGS. 3*a* and 3*b* illustrate one embodiment of the current invention that solves these problems. In this embodiment, the memory banks are separated into discontiguous portions. Despite placing portions of the banks in separate locations, the columnar arrangement of sub-arrays, one from each bank, is retained, and the columns are rotated ninety degrees relative to the configuration addressed above. Thus, rather than being parallel to the contiguous sides 44 and 46, the columns are now parallel to the near side 42. For example, the sixteen sub-arrays associated with access pad 40A (000 through 1500) extended along contiguous side 44 in the prior art die depicted in FIG. 1. Again, this group of sub-arrays commonly coupled to access pad 40A is highlighted to show the new orientation of the sub-arrays and of the group in general. In FIG. 3*a*, this group of sub-arrays now extends along the near side 42. While this group of sub-arrays 000 through 1500 is still relatively near contiguous side 44, this is not necessary for purposes of the current invention; this group could occupy any of the columnar positions depicted in FIG. 2. Regardless of the particular position of the columns, it is preferred that their respective access pad remain relatively close by. Moreover, given this new configuration, each sub-array is now oriented perpendicular to the near side 42 of the die 22.

Further, it should be noted that, while the arrangements of sub-arrays in FIG. 2 might be described as "rows" given the ninety degree rotation, the arrangements are referred to as "columns" or "columnar positions" for purposes of demonstrating the continuity with portions of the die architecture in FIG. 1.

As an example of this continuity, the row decoder circuitry 28 and column decoder circuitry are also rotated ninety degrees and, therefore, retain their orientation relative to each sub-array. Column decoder devices in this embodiment include a first modified column decoder circuit 60 interposed between a 700 series of sub-arrays (700 to 703) and an 800 series of sub-arrays (800–803). In addition, a first modified column select line 62 extends from the first modified column decoder circuit 60 through sub-arrays 700 to 000. Similarly, a second modified column select line 64 extends from the first modified column decoder circuit 60 through sub-arrays 800 to 1500. This embodiment also includes three other similarly configured modified column decoder circuits 66, 61, and 67, each with their own modified column select lines 68 and 70, 63 and 65, and 69 and 71, respectively.

Moreover, instead of two 64× DC sense amps 30 and 32, this embodiment of the present invention uses four 32× DC sense amps 52, 54, 56, and 58. However, as in the prior art, the size and number of DC sense amps merely affect data compression and no one DC sense amp configuration is required for any embodiment of the current invention.

In this exemplary embodiment, the columns are further arranged in groups of four. In doing so, this embodiment partially retains some of the bank continuity found in the prior art. For example, the sub-array sequence 000, 001, 002, and 003 of Bank 0 remain contiguous. The Bank 0 sequence continues in the next four rotated columns with sub-arrays 004, 005, 006, and 007 remaining next to each other. These intervals of bank continuity apply to the other memory banks as well and aid in minimizing the complexity of row decoder and column decoder circuitry. Arranging the columns in groups of four also means that certain columns will be further away from the near side 42 than other columns. As a result, there may be unassociated sub-arrays between a column and its access pad. For example, connective circuitry (not shown) coupling column 003–1503 to access pad 40D will probably pass by sub-arrays within columns 002–1502, 001–1501, and 000–1500.

Figure 4:
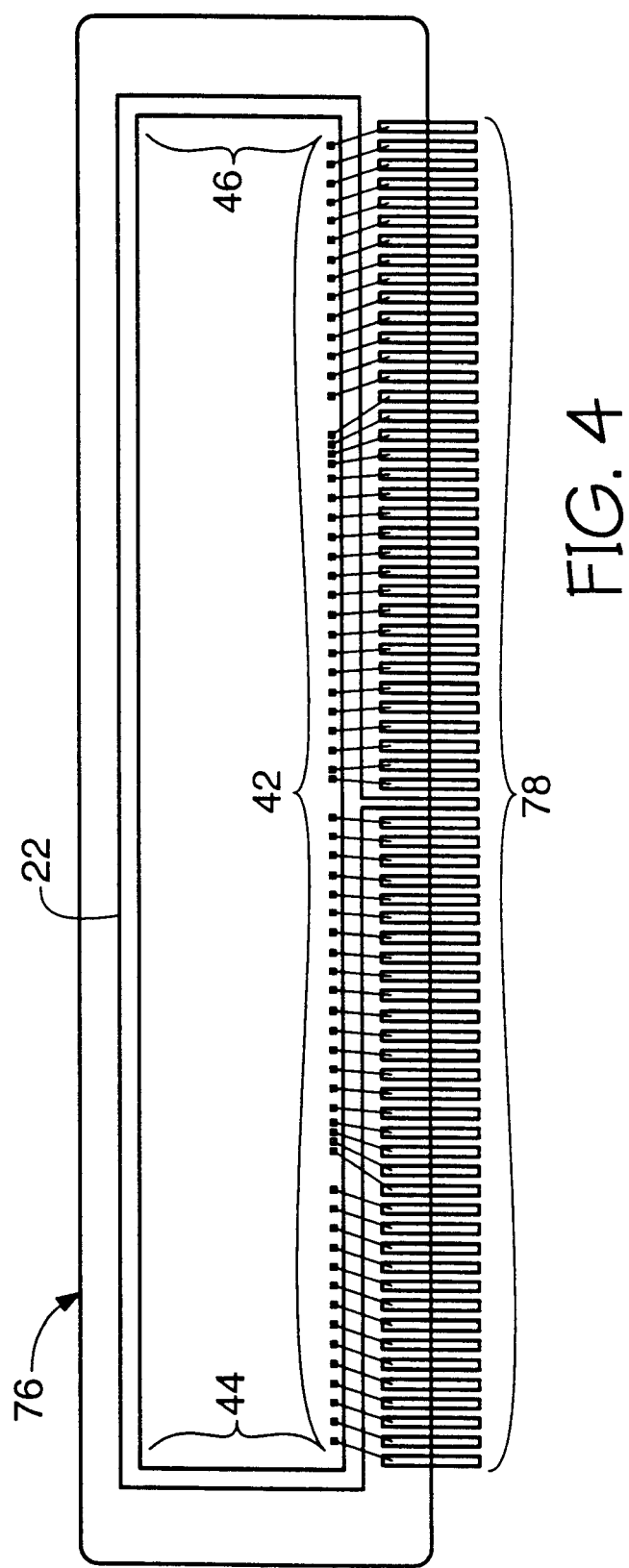
FIG. 4 represents an embodiment of the present invention in cooperation with a lead frame.

Additionally, this arrangement of rotated columns allows for altering the dimensions of the die 22. Not only can the near side 42 be extended to a length commensurate with the data bus, but the contiguous sides 44 and 46 may also be shortened. Moreover, extending the near side 42 provides chip space for the bond pads 40 that had been along the contiguous sides 44, 46 in the prior architecture. FIG. 4 demonstrates the result of this architecture: when the die 22 is attached to a lead frame 76 having conductive leads on only one side, the die's formation accommodates short conductive leads 78 of uniform length. Packaging the die 22 with this lead frame 76, in turn, allows for fast operation of the die 22 in conjunction with a device having a relatively large number of data terminals, such as a wide data bus.

Figures 5A, 5B:
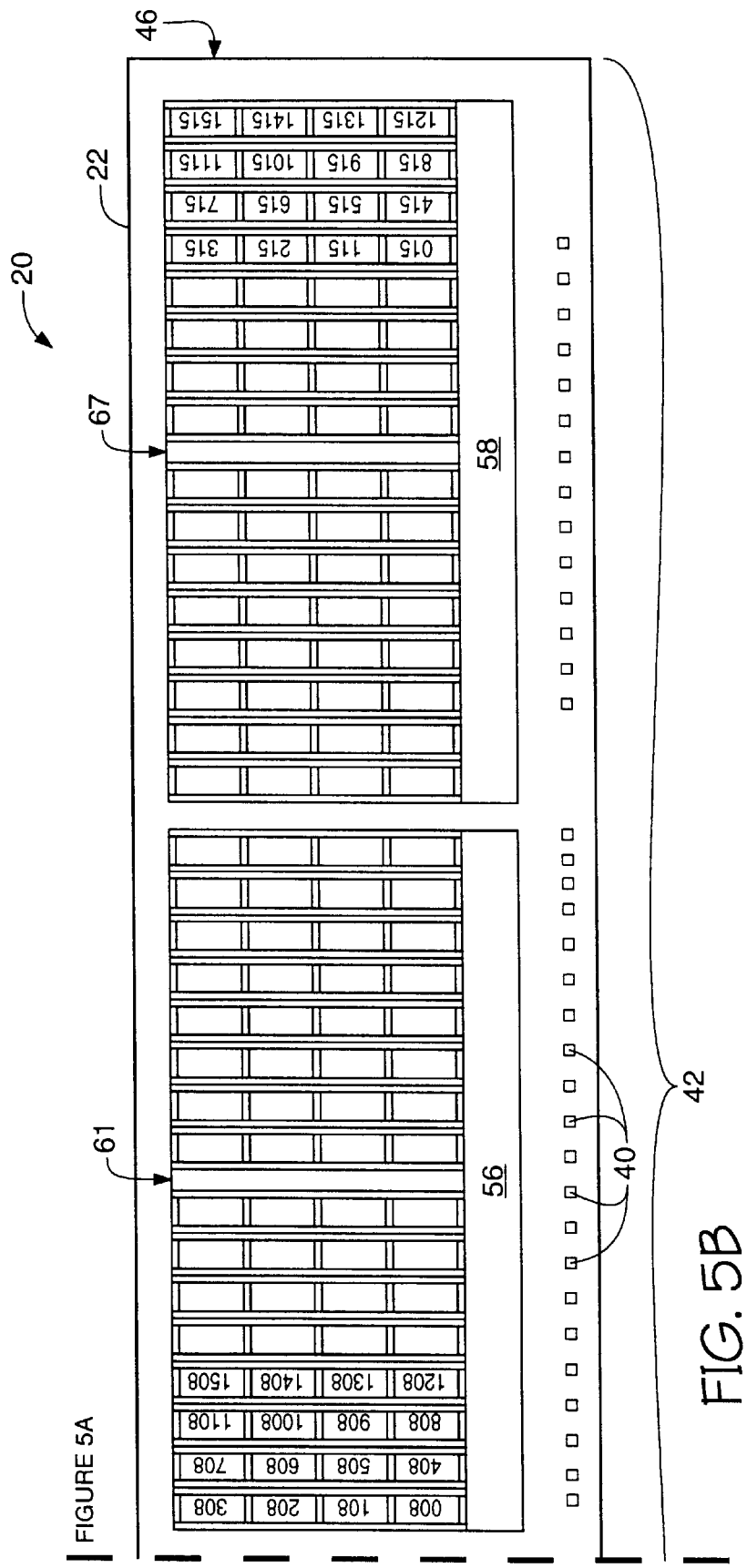
FIGS. 5a and 5b demonstrate a second exemplary embodiment of the present invention.
Figure 5D:
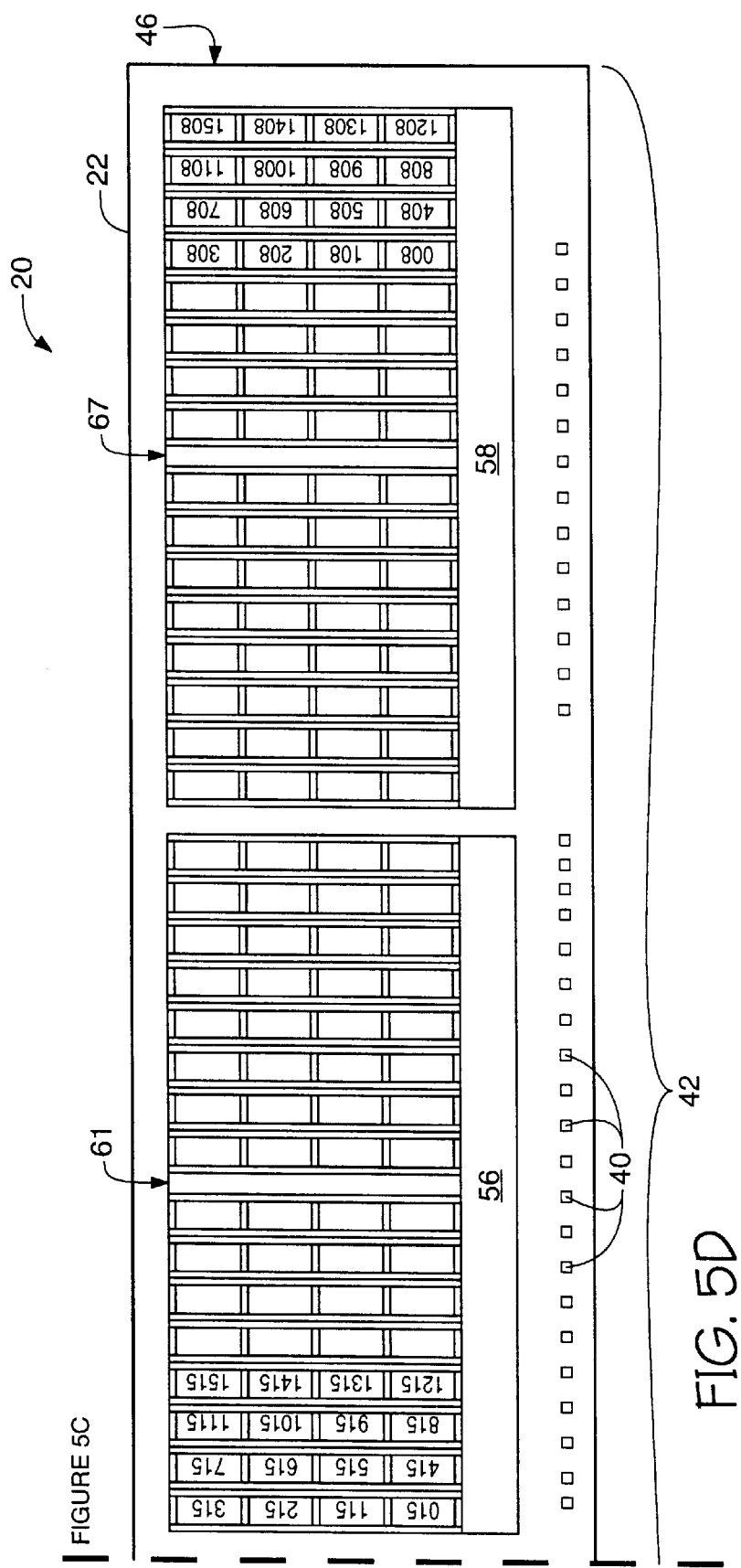

Other embodiments of the present invention can lead to the same packaging advantages. The exemplary embodiment in FIGS. 5a and 5b, for instance, demonstrates that, although the sub-arrays are rotated ninety degrees as in FIGS. 3a and 3b, it is not necessary to retain the columnar arrangement of the previous embodiment. Instead of the 16×1 columns, the sub-arrays in FIGS. 5a and 5b have been grouped into 4×4 associations. As demonstrated in the previous embodiment, there is a repetition of the sub-array pattern at continuous intervals. In the embodiment shown in FIGS. 5a and 5b, sequential sub-arrays of a particular bank are separated by sub-arrays of other banks. Sub-arrays 000 and 001 of Bank 0, for example, are separated by sub-arrays 400, 800, and 1200. As further demonstrated in the previous embodiment, it is still preferred to configure the access pads near their respective grouping. Nevertheless, because the associated sub-arrays in FIGS. 3a and 3b extend along one dimension and include one sub-array from every bank, there is more sharing of row decoder circuitry 28 as well as column select circuitry 62, 64, 68, 70, 63, 65, 69, and 71 in that embodiment than in the more fragmented sub-array groupings depicted in FIGS. 5a and 5b. Accordingly, the embodiment in FIGS. 3a and 3b is the more preferred embodiment of the two. FIGS. 5c and 5d represent an alternate configuration of 4×4 associations.

Figures 6A, 6B:
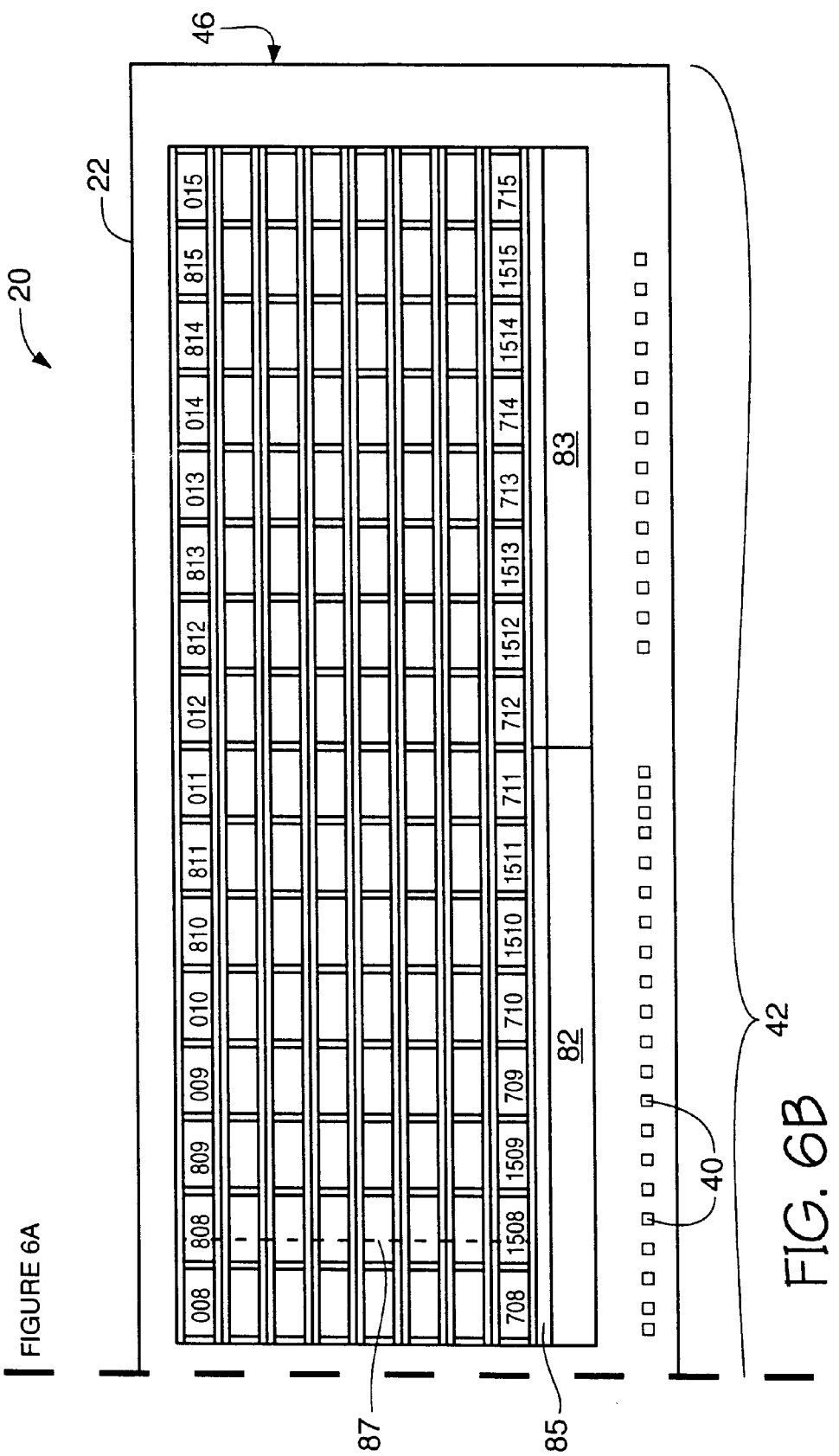
FIGS. 6a and 6b depict a fourth exemplary embodiment of the present invention.

There are also alternative embodiments that do not involve rotating the orientation of the sub-arrays, as demonstrated in FIGS. 6a and 6b. Whereas there are sixteen rows of sub-arrays extending back from the near side 42 of the die 22 in FIG. 1, the die 22 in FIGS. 6a and 6b has a memory configuration only eight sub-arrays "deep." Further, the sub-arrays are gathered into 8×2 groupings, again with one sub-array from every bank in each group and with each group associated with a particular access pad. Moreover, each group is oriented perpendicular to the near side 42 of die 22. Group 90 has been defined to contain sub-arrays 000 through 1500, group 92 contains sub-arrays 001 through 1501, and group 94 contains sub-arrays 002 through 1502. While no particular order of groups is required, it is noteworthy in this embodiment that the sub-arrays 800 through 1500 in group 90 are next to sub-arrays 801 through 1501 in group 92. In effect, groups 90 and 92 could be considered "mirror images" of each other. This mirror image configuration is useful in compressing data for test modes and in maximizing the opportunity to share row decoder circuitry 28. It can further be seen in FIGS. 6a and 6b that group 94 is a mirror image of group 92, wherein sub-arrays 002 through 702 are respectively contiguous to sub-arrays 001 through 701. While these mirror image configurations are preferable in a die architecture having 8×2 sub-array groupings, they are not necessary to realize the current invention. As in other embodiments, this one has a die shape capable of including bond pads in a configuration accommodatable to communication with an external device, with a memory arrangement generally conforming to the die shape.

The embodiment in FIGS. 6a and 6b also benefits from four 32× DC sense amps 80, 81, 82, and 83. Further, there are two column decoder circuits 84 and 85, each associated with respective column select lines 86 and 87. Unlike the previous embodiments, however, each sub-array is oriented parallel to the near side 42 of the die 22. FIGS. 6c and 6d represent an alternate configuration of 8×2 associations or groupings of sub-arrays.

One of ordinary skill can appreciate that, although specific embodiments of this invention have been described for purposes of illustration, various modifications can be made without departing from the spirit and scope of the invention. For example, embodiments of die architecture covered by this invention need not be restricted to placing bond pads on only one side of a die. It may be desirable in certain applications to use a lead frame having conductive leads facing two or more sides of a die. Die architectures included within the scope of this invention could locate the die's bond pads to allow for conductive leads of a uniform length and, more specifically, a uniformly short length on all relevant sides. In addition, the dimensions of the memory banks could be adapted to conform to a particular die's requirements. If, for example, the number of bond pads and the conductive lead pitch limitations require a die side even longer than the near side 42 in FIGS. 5a and 5b, the 4×4 banks of rotated sub-arrays can be replaced with an embodiment having a series of rotated sub-arrays grouped into 2×8 banks. Accordingly, the invention is not limited except as stated in the claims.

What is claimed is:

1. A random access memory having contact pads, comprising:

a first memory bank comprising a first plurality of sub-arrays located on only one side of all contact pads of said random access memory; and a second memory bank comprising at least one sub-array, wherein one sub-array of said second memory bank is flanked by sub-arrays of said first memory bank.

2. The random access memory in claim 1, wherein said first memory bank comprises a sub-array flanked by sub-arrays of said second memory bank.

* * * * *